United States Patent [19]
Scheffer

[11] 4,030,657
[45] June 21, 1977

[54] WIRE LEAD BONDING TOOL
[75] Inventor: Harvey Dow Gibson Scheffer, Westfield, N.J.
[73] Assignee: RCA Corporation, New York, N.Y.
[22] Filed: Dec. 26, 1972
[21] Appl. No.: 318,530
[52] U.S. Cl. .............................. 228/1 R; 228/4.5; 228/110
[51] Int. Cl.² ........................................ B23K 21/02
[58] Field of Search ............ 228/1, 54, 3, 4.5, 3.1, 228/110; 219/69 M, 229, 68; 156/73, 580; 29/470.1, 557

[56] References Cited
UNITED STATES PATENTS

| | | | |
|---|---|---|---|
| 3,101,635 | 8/1963 | Kulicke, Jr. .................. | 29/470.1 X |
| 3,128,649 | 4/1964 | Avila et al. ............................. | 228/1 |
| 3,426,951 | 2/1969 | Pohlman et al. ....................... | 228/1 |
| 3,460,246 | 8/1969 | Hatton ............................... | 219/68 X |
| 3,627,192 | 12/1971 | Killingsworth .................. | 219/229 X |
| 3,690,538 | 9/1972 | Gaiser et al. .................. | 29/470.1 X |
| 3,750,926 | 8/1973 | Sakamoto et al. ............ | 29/470.1 X |

Primary Examiner—Ronald J. Shore
Assistant Examiner—Gus T. Hampilos
Attorney, Agent, or Firm—H. Christoffersen; Samuel Cohen; William Squire

[57] ABSTRACT

A bonding tool for ultrasonically bonding wire leads is provided with a bonding tip having a pitted bonding surface thereby providing improved tool gripping action with respect to the lead that is being bonded.

2 Claims, 9 Drawing Figures

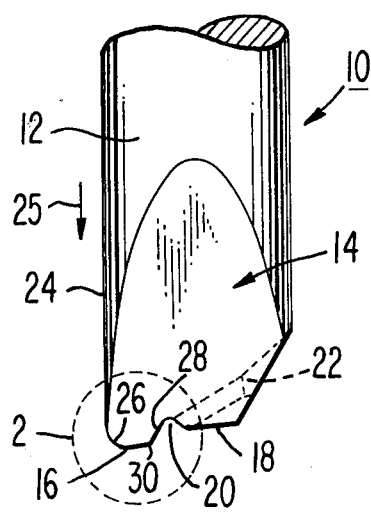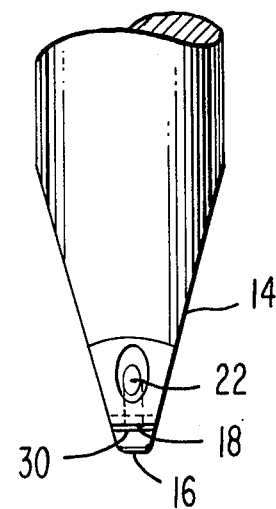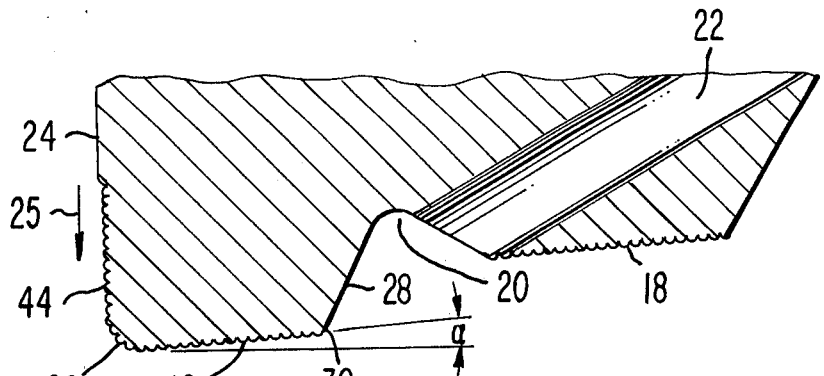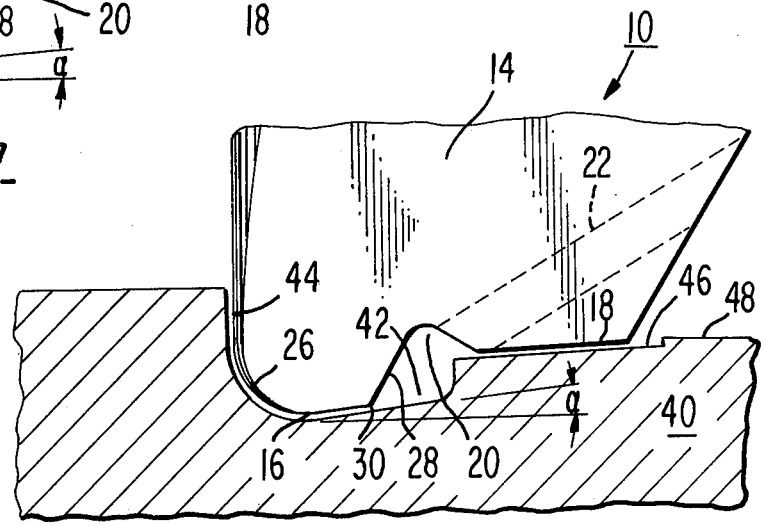

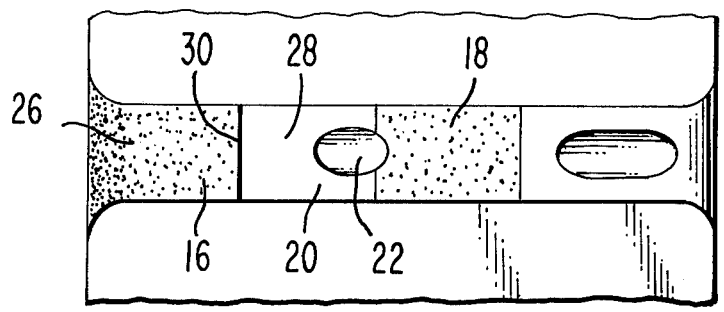
_Fig._4_
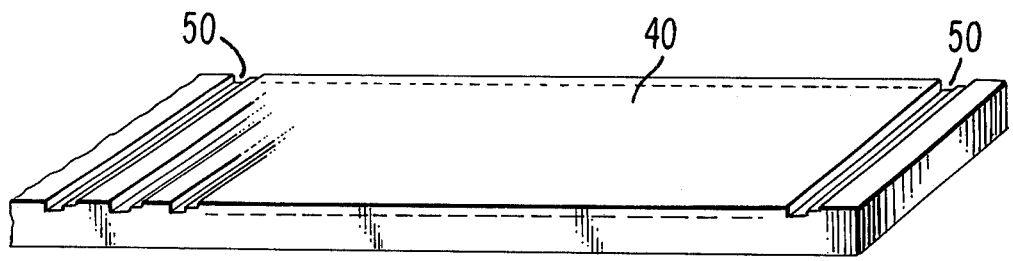
_Fig._5_
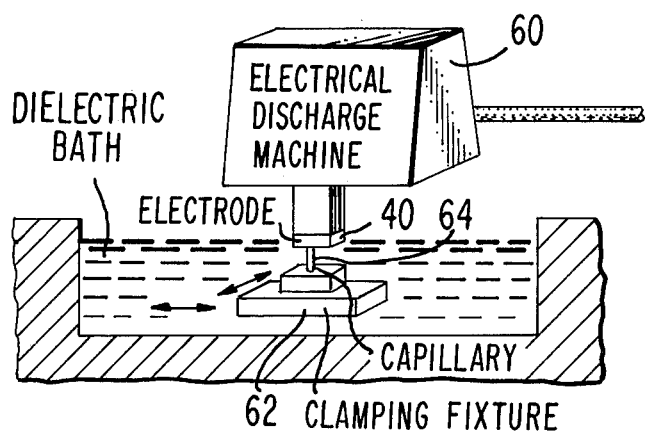
_Fig._6_
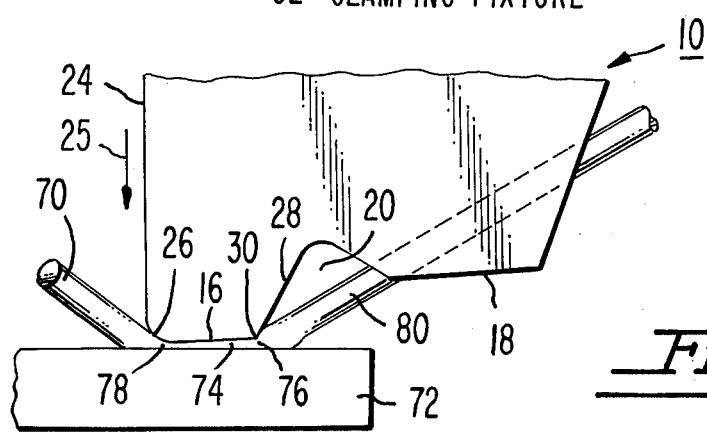
_Fig._7_

WIRE LEAD BONDING TOOL

BACKGROUND OF THE INVENTION

The present invention relates to bonding tools for bonding wire leads to a contact. In the manufacture of semiconductor devices one of the steps includes attaching an electrical connection between a contact area on the semiconductor device and a corresponding electrical lead. It is often necessary to make connections between individual circuit elements on the device itself.

One type of prior art bonding tool employs ultrasonic techniques. A so called wedge bonding tool has a bonding tip of about 3 mils on a side which is vibrated against the wire lead to be bonded at ultrasonic frequencies. Extremely high vibrations used in this technique result in the joining of the wire lead to the contact area to which the lead is to be connected. However, this type of bonding does not always yield reliably bonded connections. As a result, undesirable economic losses are incurred in the manufacturing processes due to the failure of these bonds in a portion of a given production manufacturing batch. Such failures need to be detected and screened prior to utilization of the assembled device in its intended environment. This further adds to the cost of production of these devices.

The present invention is directed to the cause of failure of these bonded connections. Ordinarily the bonding tools are manufactured by a grinding technique. It has been found that such manufacturing techniques produce a given surface finish on the bonding tip of the tool. It has been discovered that the cause of the bonding failure is attributable to the particular finish on the bonding bit itself. In essence the tool constructed in accordance with the present invention is provided a surface finish which enhances a mechanical bond between a lead and a mating contact surface and provides longer lasting tools, as well as greatly improved reliability of the bonded product.

SUMMARY OF THE INVENTION

A bonding tool which provides improved ultrasonic bonds between a lead and a contact comprises a bonding tool shank having a bonding tip disposed on one end thereof for engaging the lead during the bonding. The bonding tip is provided a pitted surface including a plurality of nodules and voids. As a result, this pitted surface provides greatly improved ultransonic bonding action of the wire lead to the adjacent contact to which the lead is being attached.

The method of making a bonding tool for ultrasonically bonding a lead to a contact comprises forming an ultrasonic bonding tool tip for engaging a lead during the bonding and pitting the surface of said tip so that said tip surface is provided a plurality of nodules and voids.

IN THE DRAWINGS

FIGS. 1a and 1b are respective side and rear elevational views of a bonding tool constructed in accordance with the present invention, FIG. 2 is an enlarged cross sectional view of the side elevational view of FIG. 1a in the dotted circle numbered 2, FIG. 3 is a side elevational view of a bonding tool during the forming thereof in accordance with an embodiment of the present invention, FIG. 4 is a bottom plan view of the bonding tool of FIG. 2, FIG. 5 is a perspective view of an electrode tool used in the process of forming the bonding tool of the present invention, FIG. 6 shows the environment in which the bonding tool is constructed utilizing an electrical discharge machine to form the bonding tool tip, FIG. 7 illustrates an enlarged side elevational view of the bonding tool of FIG. 1 bonding a wire lead to a contact, and FIG. 8 is a photographic presentation of a bonding tool surface of the present invention as seen through an electron scanning microscope at a magnification of 2000 x.

DETAILED DESCRIPTION

Figure 8:
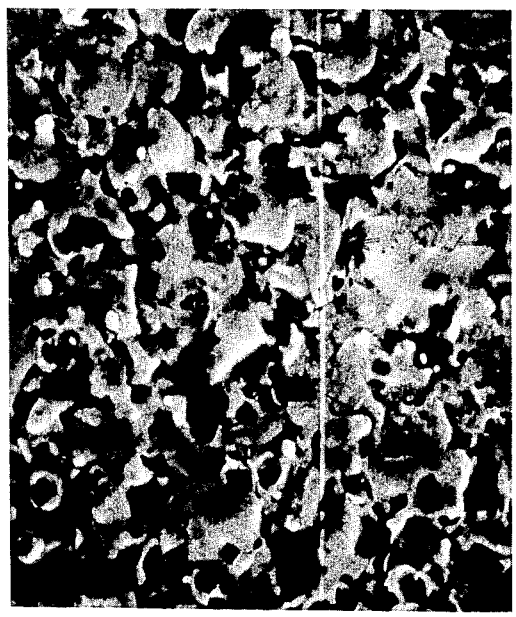

In FIGS. 1a and 1b bonding tool 10 includes a shank portion 12 and an end portion 14 which tapers toward the bonding tool tip surface 16 and heel 18, tip surface 16 terminating further from shank portion 12 than heel 18, as shown. Because of the tapered shape at end 14, this bonding tool is sometimes referred to as a wedge bonding tool.

Disposed intermediate heel 18 and tip surface 16 is a transverse groove 20. Opening at one end of the side of groove 20 and heel 18 is a capillary 22 in which the wire lead (see FIG. 7) to be bonded is inserted as known in the wire bonding tool art. Tip surface 16 engages a wire lead (not shown in FIGS. 1a and 1b) inserted in capillary 22 which extends beneath tip 16 adjacent thereto for bonding the lead to a contact surface. End 14 has a forward surface 24 which extends generally in the direction of arrow 25 toward lower forward surface 44 (FIG. 2) and intersects tip surface 16 by way of radius 26 at the forward edge of surface 16. The rearward edge of surface 16 intersects surface 28 at intersection 30. Surface 28 slopes upwardly and rearwardly from surface 16 toward shank 12, as shown. Intersection 30 is relatively sharp in comparison with the size of radius 26 as known in the ultrasonic bonding tool art.

As provided in accordance with the present invention, the lower forward surface 44, radius 26, tip surface 16, intersection 30 and heel 18 (heel 18 optional) are pitted with a predetermined surface roughness as best seen in FIG. 8.

As seen in FIG. 8 this pitted surface resembles a sponge-like surface in that the surface comprises a plurality of nodules and voids. To provide the gripping action in accordance with the present invention, these nodules and voids have a depth in the vertical direction of arrow 25 (FIG. 2) in the range of about 4 to 25 microinches and a diameter in the horizontal direction transverse arrow 25 in the range of about 1 microinch to 0.7 mils. The pitted surface 16, provided for example, by an electrical discharge machine, increases the gripping action between the wire bonding tool 10 and the wire lead to be bonded. In this action tool 10 is vibrated at ultrasonic frequencies in a fore and aft direction in and out of the drawing of FIG. 1b and grips the wire lead at tip surface 16 which is generally in the order of 3 mils long on a side. Tip surface 16 grips the wire and wipes the wire against the contact to which the wire is to be bonded. If surface 16 has a relatively smooth surface having a microfinish less than 4 microinches, both vertically and horizontally, surface 16 will not satisfactorily grip the wire lead in a positive manner, slips and therefore generates a poor bond between a wire lead and a contact. However, it is believed that as a result of pitting surface 16 as provided herein, a large number of gripping fingers on surface 16 provided by both the voids and nodules transfer the energy from surface 16 to the wire thus gripping the wire to be bonded preventing slippage between the wire and surface 16 providing a substantially improved wire bond. It is believed that some of the wire lead is forced into the voids to provide this positive grip to the bonding tool.

Surface 16 should not be made too rough. For example, a surface roughness exceeding 25 microinches vertically and nodules greater than 0.7 mils in diameter in the plan view or horizontal direction results in a poor bond. In this last mentioned instance, the number of gripping fingers while more numerous than an extremely smooth surface such as produced by a grinding operation will not satisfactorily grip the wire in the manner provided in accordance with the present invention. It is believed that in this latter case the number of gripping fingers are too few.

This pitting action provides for a generally rough surface in the areas of the tool indicated above. This pitting is preferably accomplished by exposing the areas to be pitted to an electrical discharge machine arc. In electrical discharge machining it is known that the electric arc removes material leaving a pitted surface. Generally, this may be accomplished by first grinding in a conventional manner or otherwise forming by suitable means the bonding tool tip having the general outline indicated in FIGS. 1a and 1b. Then, the tool is mounted on an electrical discharge machine having an electrode 40 shaped as shown in FIG. 3. Tip surface 16 slopes upward away from radius 26 toward shank 12 at an angle $\alpha$. Surface 16 is generally planar between intersection 30 and radius 26.

The angle $\alpha$ is preferably 1° to 4° such that the surface 16 makes an angle with the direction of travel of the tip when forced against the wire in the direction of arrow 25 of about 86° to 89°. The reason for providing the angle $\alpha$ will be explained later.

In FIG. 3 the electrical discharge machine electrode 40 has a U-shaped channel 42 whose bottom surface slopes gradually upwardly at angle $\alpha$ corresponding to angle $\alpha$ of surface 16. As will be appreciated channel 42 shapes radius 26, front lower edge 44 and tip surface 16 to the configuration shown. One rim 46 of the channel 42 slopes upwardly and away from a channel 42 wall at a slight angle of about 4° so as to form heel 18 in bonding tool 10.

Rim 46 extends away from channel 42 a sufficient distance to allow slight clearance between the rearward edge of heel 18 and upper surface 48 of the electrode as shown. Groove 20 of end 14 is preformed. The bonding tool to be formed by electrode 40 is then nested within channel 42 and rim 46, as shown. The arcing removes the metal from end 14 at radius 26, surfaces 44 and 16 and heel 18 which are pitted by the electrical discharge machine. In FIG. 4 the speckled portion of these surfaces indicates the areas that are pitted by electrode 40. Consequently, electrode 40 not only shapes the bonding end of tool 10 but also produces the desired surface roughness. The pitted surface finish is affected by frequency and shape of pulse as well as electrode materials which are suitably selected in a manner known in the electrical discharge machine art. In FIG. 5 a perspective view of a typical electrode used for electrical discharge machining with wire bonding tools in accordance with the present invention illustrates an electrode having a plurality of parallel grooves 50 each having a cross section which is identical to that shown in the enlarged cross sectional view of one groove in electrode 40 of FIG. 3. The electrode of FIG. 5 is preferably about 1 inch wide by 2 inches long. With such dimensions hundreds of bonding tools 10 may be finished with a single electrode 40 of FIG. 5.

To produce the wire bonding tool of the present invention, "capillary" as known in this art, FIG. 6 shows an electrical discharge machine 60 to which electrode 40 is secured and mounted in spaced relationship to a transversely and longitudinally operable wire bonding tool or "capillary" clamping fixture 62. Fixture 62 has affixed thereto wire bonding tool 64 with the wedge end of the tool facing electrode 40 in the manner illustrated in FIG. 3. Tool 64 is aligned with one of the grooves 50 of the electrode. The electrode, tool and tool clamp fixture are submerged in a suitable dielectric bath as known in electrical discharge machining art. The position of tool 64 with respect to electrode 40 is noted on a suitable micrometer setting (not shown) on fixture 62 which determines the transverse and longitudinal positions of fixture 62. The next wire bonding tool installed in fixture 62 is then transversed along groove 50 to an unused portion of the groove and the process of electrical discharge machining is repeated.

In FIG. 7 there is shown an enlarged side elevational view of a wire bonding tool 10 constructed in accordance with the present invention bonding a wire lead 70 to a contact 72. In bonding lead 70 to contact 72, tool 10 is compressed against lead 70 so as to sandwich lead 70 between contact 72 and surface 16. When tool 10 is operated in ultrasonic frequencies, portion 74 of lead 70 disposed between surface 16 and contact 72 is crushed therein and slightly extruded by the ultrasonic action. By providing angle $\alpha$ to surface 16, the rearmost portion 76 of lead 70 is thicker than the forward portion 78.

The thicker portion 76 being wider than thinner portion 78 prevents premature breakage of lead 70 at the sharp depression in lead 70 formed by sharp intersection 30. Thus improved reliability is provided leads bonded with a tool constructed in accordance with the present invention. Intersection 30 is generally kept sharp to enable an operator to break off lead 70 at the depression formed by intersection 30 as generally known in this art. This occurs when tool 10, after finishing bonding lead 70, is transversed with lead 70 still in capillary 22 such that surface 16 engages lead 70 at a different place therealong adjacent a separate, different contact on a semiconductive device to be interconnected to contact 72. The semiconductor device contact is bonded to lead 70 and at this time the portion of lead 80 between surface 16 and heel 18 represents an extending pigtail on the lead and needs to be disconnected from the interconnecting lead. A sharp depression created by intersection 30 permits an operator when lifting tool 10 in the direction reverse of arrow 25 to snap off portion 80 of lead 70. The reverse order of bonding the semiconductor first and the external electrical connection may also be used.

Thus, as provided in accordance with the present invention, an apparatus and method are shown wherein pitting of the bonding tool tip provides bonds of improved reliability, which relieves a long standing problem in the electronics bonding industry.

What is claimed is:

1. A wire bonding tool for ultrasonically bonding a lead to a contact comprising:

an elongated shank portion extending in a first direction, a tip portion disposed at one end of said shank portion, said tip portion having a forward edge, a rearward edge and a planar bottom surface for engaging said lead during said bonding, said bottom surface tapering toward said shank portion in a second direction from said forward edge to said forward edge such that said bottom surface forms an angle of less than 90° with said first direction.

2. The tool of claim 1 wherein said angle is in the range of 85° to 89°.

* * * * *

UNITED STATES PATENT AND TRADEMARK OFFICE
CERTIFICATE OF CORRECTION

PATENT NO. : 4,030,657
DATED : June 21, 1977
INVENTOR(S) : Scheffer

It is certified that error appears in the above-identified patent and that said Letters Patent is hereby corrected as shown below:

Claim 1, line 10, "forward" (second occurrence) should be --rearward--.

Signed and Sealed this

Twenty-seventh Day of March 1984

[SEAL]

Attest:

GERALD J. MOSSINGHOFF

Attesting Officer     *Commissioner of Patents and Trademarks*